United States Patent
Ho

(10) Patent No.: US 10,014,848 B1
(45) Date of Patent: Jul. 3, 2018

(54) COMPENSATION CIRCUIT FOR INPUT VOLTAGE OFFSET OF ERROR AMPLIFIER AND ERROR AMPLIFIER CIRCUIT

(71) Applicant: ELITE SEMICONDUCTOR MEMORY TECHNOLOGY INC., Hsinchu (TW)

(72) Inventor: I-Hsiu Ho, Hsinchu County (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 0 days.

(21) Appl. No.: 15/687,115

(22) Filed: Aug. 25, 2017

(51) Int. Cl.
*H03K 5/003* (2006.01)
*H03K 19/0185* (2006.01)

(52) U.S. Cl.
CPC ..... *H03K 5/003* (2013.01); *H03K 19/018521* (2013.01)

(58) Field of Classification Search
CPC .......................... H03K 5/003; H03K 19/0185
See application file for complete search history.

(56) References Cited

U.S. PATENT DOCUMENTS

| | | | |
|---|---|---|---|
| 8,207,711 B2 * | 6/2012 | Crawford | H05B 33/0815 315/291 |
| 8,253,400 B2 * | 8/2012 | Irissou | H02M 3/156 323/282 |
| 8,624,511 B2 | 1/2014 | Cavallini et al. | |
| 9,161,402 B2 | 10/2015 | Kim et al. | |
| 2008/0048737 A1 | 2/2008 | Ito et al. | |

\* cited by examiner

*Primary Examiner* — Jeffrey Zweizig
(74) *Attorney, Agent, or Firm* — WPAT, PC

(57) ABSTRACT

A compensation circuit for compensating an input voltage offset of an error amplifier has a level shifter, a first trimming circuit, a second trimming circuit, and a compensation current sinking device. The level shifter shifts levels of a feedback voltage and a predetermined reference voltage and outputs a level shifted feedback voltage and a level shifted reference voltage. The first trimming circuit adjusts the level shifted reference voltage by trimming a first resistance thereof according to a trimming code, wherein the trimming code has the ratio relation of the input voltage offset and a resistance to be trimmed. The second trimming circuit adjusts the level shifted feedback voltage by trimming a second resistance thereof according to a trimming code. The compensation current sinking device sinks currents passing through the first and second trimming circuits.

20 Claims, 5 Drawing Sheets

US 10,014,848 B1

COMPENSATION CIRCUIT FOR INPUT VOLTAGE OFFSET OF ERROR AMPLIFIER AND ERROR AMPLIFIER CIRCUIT

FIELD OF THE INVENTION

The present disclosure relates to an error amplifier circuit, and in particular, to a compensation circuit for an input voltage offset of an error amplifier and an error amplifier circuit having the compensation circuit.

BACKGROUND OF THE INVENTION

The current marketed switching mode light emission diode (LED) driver is operated in a boundary current mode (BCM) and also has a closed loop circuit for locking a LED current. Referring to FIG. 1, FIG. 1A is a schematic diagram of a conventional switching mode LED driver. The conventional switching mode LED driver 1 comprises a current-to-voltage converter 11, an error amplifier EA, a compensation capacitor C_COMP, and a comparator CMP. The current-to-voltage converter 11 is connected to the error amplifier EA, and the error amplifier EA is connected to the compensation capacitor C_COMP and the comparator CMP.

The LED current iLED (i.e. the current passing through the LED) is fed back to the switching mode LED driver 1, and the current-to-voltage converter 11 receives the LED current iLED and converts the LED current iLED to the feedback voltage CS, wherein the LED current iLED is a triangle signal, and thus the feedback voltage CS is also a triangle signal. The error amplifier EA receives the feedback voltage CS and the reference voltage VREF, and then compares the feedback voltage CS with the reference voltage VREF to generate the error signal COMP accordingly. The compensation capacitor C_COMP is connected between the output end of the error amplifier EA and a ground GND, and used to compensate the error signal COMP. The comparator CMP compares the error signal COMP with a saw signal V_SAW to generate a pulse signal DUTY which is used to modulate the LED current iLED.

Referring to FIG. 1B, FIG. 1B is a schematic diagram of an error amplifier. The error amplifier EA comprises a current source IS, NMOS transistors MN1 through MN4, and PMOS transistors MP1 through MP4. Source ends of the PMOS transistors MP3 and MP4 are connected to a high voltage, such as a system voltage, gate ends of the PMOS transistors MP3 and MP4 are connected to each other, and drain ends of the PMOS transistors MP3 and MP4 are respectively connected to the gate end of the PMOS transistor MP3 and one end of the compensation capacitor C_COMP.

Source ends of the NMOS transistors MN1 through MN4 are connected to a low voltage, such as a ground voltage, gate ends of the NMOS transistors MN1 and MN3 are connected to each other, gate ends of the NMOS transistors MN2 and MN4 are connected to each other, drain ends of the NMOS transistors MN3 and MN1 are respectively connected to the drain end of the PMOS transistor MP3 and the gate end of the NMOS transistor MN1, and drain ends of the NMOS transistors MN4 and MN2 are respectively connected to the drain end of the PMOS transistor MP4 and the gate end of the NMOS transistor MN2.

Source ends of the of the PMOS transistors MP1 and MP2 are connected to the current source IS, gate ends of the PMOS transistors MP1 and MP2 respectively receive the feedback voltage CS and the reference voltage VREF, and drain ends of the PMOS transistors MP1 and MP2 are connected respectively to the drain ends of the NMOS transistors MN1 and MN2. The PMOS transistors MP1 and MP2 act as a differential pair circuit, and the NMOS transistors MN1 and MN2 act as an active load circuit.

The error amplifier EA should allow a large input differential signal formed by the feedback voltage CS and the reference voltage VREF. To make sure the error amplifier EA allows larger differential signals, the error amplifier EA should have a small transconductance Gm, and the differential pair circuit and the active load circuit should respectively have small transconductances Gm1 and Gm2. However, the mismatch (i.e. voltage offset Vos2) of the active load circuit is reflected to the input voltage offset Vos2' of differential pair circuit, i.e. Vos2'=Vos2*Gm2/Gm1. So that, small Gm operating EA leads larger input offset.

To cure the deficiency of input voltage offset (i.e. reducing the input voltage offset), one manner is to increase the area of the error amplifier EA. However, in the current application, the reference voltage VREF of the conventional switching mode LED driver is required to be 200 mini volts with ±3 percent tolerance, and thus the small voltage offset is demanded.

Referring to FIG. 2A, FIG. 2A is a schematic diagram of a conventional compensation circuit for an input voltage offset of an error amplifier. The conventional compensation circuit 2 comprises a bandgap voltage generator 21, a trimming circuit 22, switches SW1, SW2, and a dimming control circuit 23. The bandgap voltage generator 21 is connected to the trimming circuit 22, the switch SW1 is connected to the trimming circuit 22 and the error amplifier EA, and the switch SW2 is connected to the dimming control circuit 23 and the error amplifier EA.

The bandgap voltage generator 21 is used to generate a bandgap voltage to the trimming circuit 21. The trimming circuit 21 has resistors R1 through R4 which are connected serially, and further has fuses F1 and F2, wherein the fuse F1 is parallel connected to resistor R2, and the fuse F2 is parallel connected to resistor R3. The connection point of the resistors R2 and R3 is connected to the error amplifier EA, so as to provide the reference voltage VREF to the error amplifier EA.

The bandgap voltage is input to the trimming circuit 21. While the input voltage offset Vos does not exist, the fuses F1 and F2 are not fused, such that the reference voltage VREF is the dividing voltage of the bandgap voltage divided by the resistors R1 and R4. While the input voltage Vos exists, at least one of the fuses F1 and F2 is fused, and the reference voltage VREF is the dividing voltage of the bandgap voltage divided by the resistors "R1, R2, R4", "R1, R3, R4", or "R1 through R4", so as to compensate the input voltage offset Vos. For example, while the required reference voltage VREF is 200 mini volts, and the input voltage offset Vos is −20 mini volts, to compensate the −20 mini volts, at least one of the fuses F1 and F2 is fused, and thus the actual reference voltage VREF is increased to 220 mini volts.

The switch SW1 is turned on while the dimming function is not enabled, and thus the reference voltage VREF which the input voltage offset Vos has been compensated is input to the error amplifier. The switch SW2 is turned while the dimming function is enabled. The dimming control circuit 23 has an analog dimming ratio curve defining the relation of an input analog signal AND and the reference voltage VREF, and thus the dimming control circuit 23 converts the input analog signal AND to the reference voltage VREF based upon the analog dimming ratio curve.

Referring to FIG. 2B, FIG. 2B is a curve diagram of an analog dimming ratio curve. The ideal analog dimming ratio curve of the dimming control circuit 23 is shown in FIG. 2B. However, the input voltage offset Vos exists, and thus the analog dimming ratio curve is shifted upward or downward due to the input voltage offset Vos. That is, the trimming circuit 21 cannot give help to the dimming control circuit 23, and the dimming control circuit 23 should adjust the ideal analog dimming ratio curve to deal with the input voltage offset Vos.

It is noted that for the analog dimming as shown in FIG. 2A and FIG. 2B, the actual reference voltage VREF for dimming can be expressed as VREF=(AND−0.2)+Vos. Furthermore, while pulse width modulation (PWM) dimming is used instead, the input voltage offset Vos still affects the PWM dimming, and the actual reference voltage VREF for dimming can be expressed as VREF=(VREF$_{IDEAL}$+Vos)*DUTY, wherein the ideal reference voltage is denoted as VREF$_{IDEAL}$, and the duty cycle is denoted as DUTY. In short, the above trimming manner for compensating input voltage offset cannot be applied in the dimming function.

There are other marketed compensation circuits for input voltage offsets of error amplifiers. However, in each of the above marketed compensation circuits, the current source of the error amplifier should be the same as the compensation current source, the biasing current should be known before compensation, and the more than two transistors in the compensation circuit should designed to be matched. Unfortunately, the biasing current shifted with the process variation is not known easily, and the design for matching more than two transistors is not easy, either.

SUMMARY OF THE INVENTION

An exemplary embodiment of the present disclosure provides a compensation circuit used to compensate an input voltage offset of an error amplifier, and the compensation circuit comprises a level shifter, a first trimming circuit, a second trimming circuit, and a compensation current sinking device. The level shifter is used to shift levels of a feedback voltage and a predetermined reference voltage, and thus to output a level shifted feedback voltage and a level shifted reference voltage. The first trimming circuit connected to the level shifter and the error amplifier is used to adjust the level shifted reference voltage by trimming a first resistance thereof according to a trimming code, wherein the trimming code has the ratio relation of the input voltage offset and a resistance to be trimmed. The second trimming circuit connected to the level shifter and the error amplifier is used to adjust the level shifted feedback voltage by trimming a second resistance thereof according to a trimming code. The compensation current sinking device connected to the first and second trimming circuits is used to sink currents passing through the first and second trimming circuits.

An exemplary embodiment of the present disclosure provides an error amplifier circuit comprising an error amplifier and the above compensation circuit.

To sum up, the provided compensation circuit for the input voltage offset of the error amplifier can be designed easily and have a small area, since merely two transistors should be designed to be matched and resistors should be designed to be matched.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION OF THE PREFERRED EMBODIMENTS

Figure 1A:
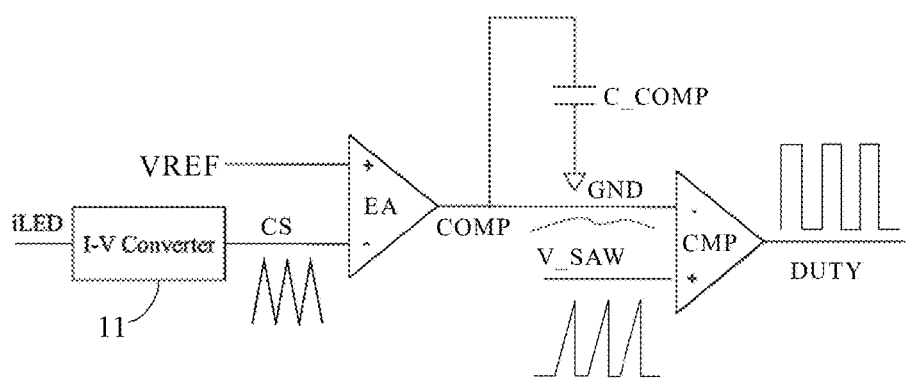
FIG. 1A is a schematic diagram of a conventional switching mode LED driver.
Figure 1B:
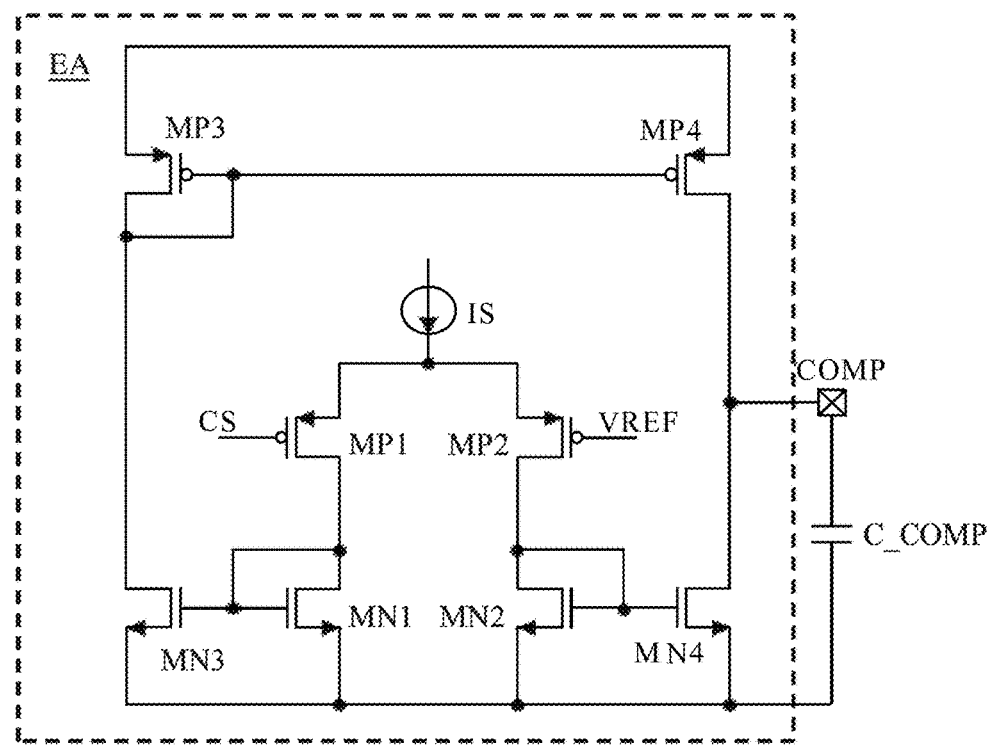
FIG. 1B is a schematic diagram of an error amplifier.
Figure 2A:
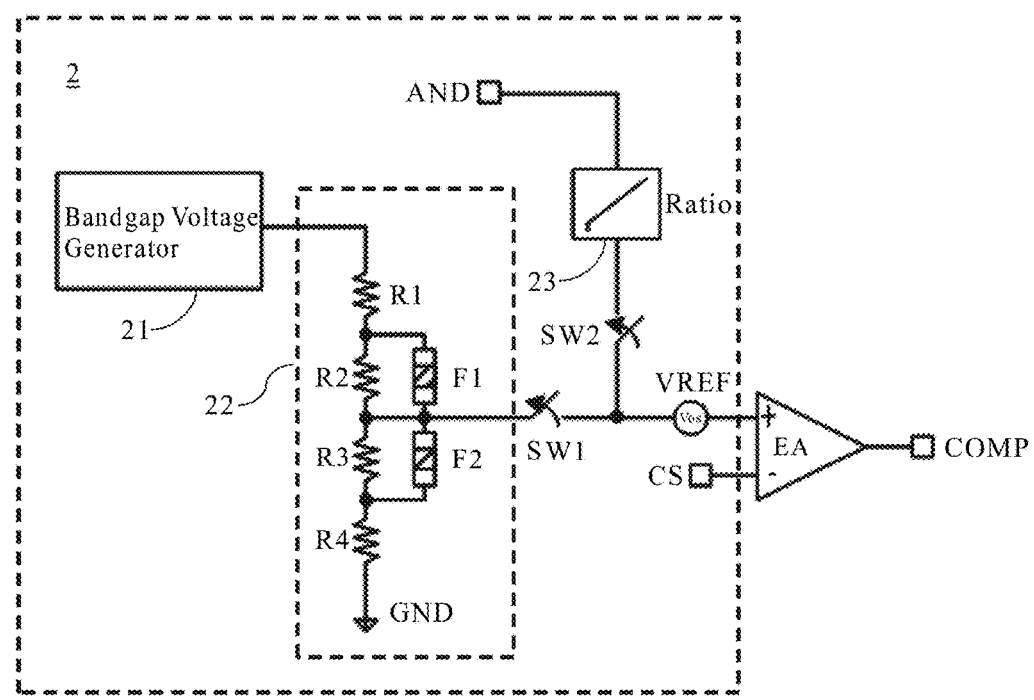
FIG. 2A is a schematic diagram of a conventional compensation circuit for an input voltage offset of an error amplifier.
Figure 2B:
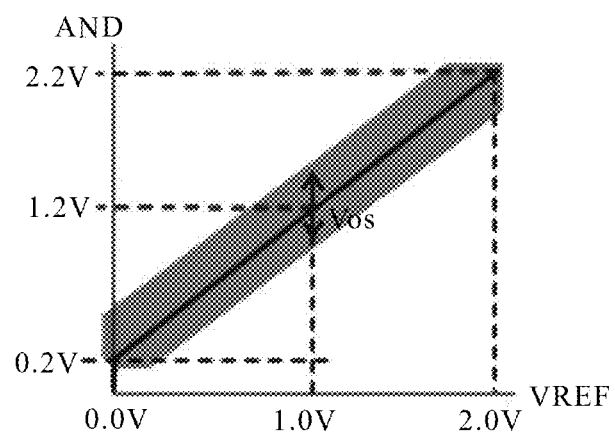
FIG. 2B is a curve diagram of an analog dimming ratio curve.

Reference will now be made in detail to the exemplary embodiments of the present disclosure, examples of which are illustrated in the accompanying drawings. Wherever possible, the same reference numbers are used in the drawings and the description to refer to the same or like parts.

An exemplary embodiment of the present disclosure provides a compensation circuit used in an error amplifier circuit, and the compensation circuit can compensate the input voltage offset of the error amplifier in the error amplifier circuit. The compensation circuit compensates the input voltage offset in front of the input ends of the error amplifier, such that merely the input voltage offset should be measured in the circuit probing process. Then, the trimming code for input voltage offset can be calculated, wherein the trimming code records the ratio relation of the input voltage offset and resistance.

In the exemplary embodiment of the present disclosure, the resistors should be designed to be matched, and merely two transistors should be designed to be matched. Thus, the matching design of compensation circuit in the exemplary embodiment of the present disclosure is easier than that of the convention compensation circuit. Moreover, since merely two transistors should be designed to be matched, the circuit area can be reduced in the exemplary embodiment without considering operation points of the other transistors and the compensation current.

The compensation circuit in the exemplary embodiment of the present disclosure comprises a level shifter, a first trimming circuit, a second trimming circuit, and a compensation current sinking device. The level shifter receives the predetermined reference voltage and the feedback voltage generated by the LED current, and outputs the level shifted reference voltage and the feedback voltage to the first and second trimming circuits respectively. Each of the first and second trimming circuits has resistors connected serially and fuses parallel connected to the resistors. The compensation current sinking device is connected to the first and second trimming circuits to sink the compensation current.

The trimming code records the ration relation of the input voltage offset and the resistance of the first or second trimming circuit to be trimmed. The fuses in the first or second trimming circuit are fused according to the trimming code, and thus the first or second trimming circuit can trim the level shifted reference voltage or the level feedback voltage to output the trimmed reference voltage or the trimmed feedback voltage to the error amplifier. Since the level shifted reference voltage or the level shifted feedback voltage is trimmed, the input voltage offset is compensated.

Figure 3:
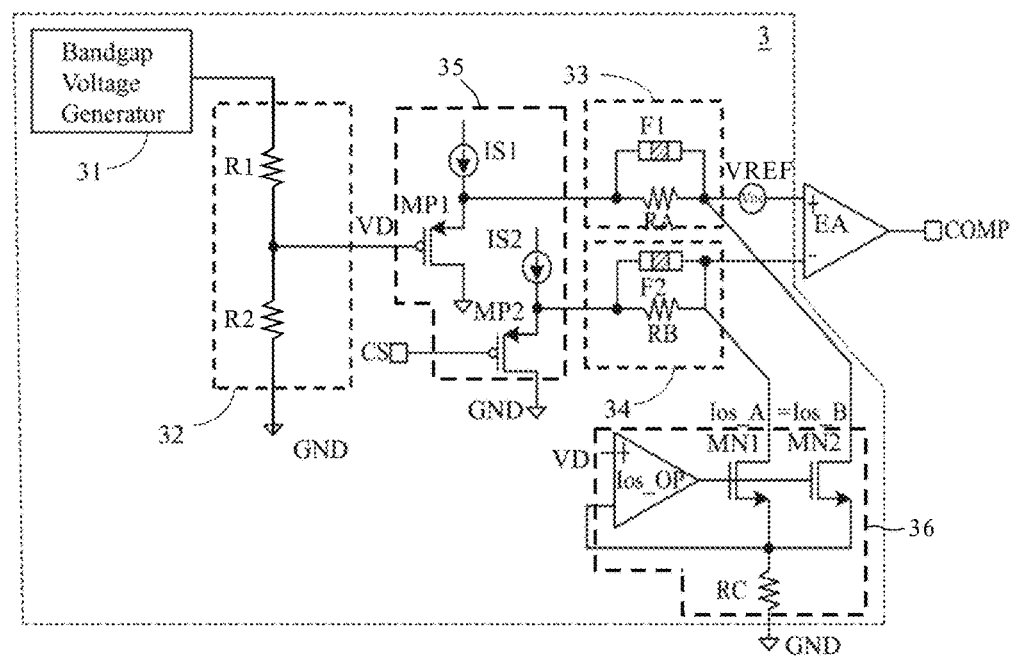
FIG. 3 is a schematic diagram of an error amplifier circuit according to an exemplary embodiment of the present disclosure.

Please refer to FIG. 3. FIG. 3 is a schematic diagram of an error amplifier circuit according to an exemplary embodiment of the present disclosure. The error amplifier circuit comprises an error amplifier EA and the compensation circuit 3. The compensation circuit 3 is connected to the error amplifier EA, and provides a trimmed reference voltage (i.e. VREF+Vos) and a level shifted feedback voltage to the error amplifier EA, or alternatively, provides a level shifted reference voltage and a trimmed feedback voltage to the error amplifier EA.

The compensation circuit 3 comprises a bandgap voltage generator 31, a voltage divider 32, a first trimming circuit 33, a second trimming circuit 34, a level shifter 35, and a compensation current sinking device 36. The bandgap voltage generator 31 is connected to the level shifter 35, and the level shifter 35 is connected to the first trimming circuit 33 and the second trimming circuit 34. The first trimming circuit 33 and the second trimming circuit 34 are connected to the error amplifier EA and the compensation current sinking device 36.

The bandgap voltage generator 31 is used to provide a bandgap voltage. The voltage divider 32 is used divides the bandgap voltage to generate a predetermined voltage VD, such as 200 mini volts. The voltage divider 32 can comprise resistors R1 and R2 connected serially, and the predetermined reference voltage VD is generated at the connection point of the resistors R1 and R2. It is noted that the implementation of the voltage divider 32 is not used to limit the present disclosure. Furthermore, the bandgap voltage generator 31 and the voltage divider 32 are not essential elements in the compensation circuit 3, and the predetermined reference voltage VD can be input to the compensation circuit 3 from an external voltage source.

The level shifter 35 is used to receive the predetermined reference voltage VD and a feedback voltage CS, and to shift levels of the predetermined voltage VD and a feedback voltage CS, so as to generate the level shifted reference voltage and the level shifted feedback voltage respectively to the first trimming circuit 33 and the second trimming circuit 34.

The level shifter 35 may be implemented by currents sources IS1, IS2 and PMOS transistors MP1, MP2, and the present disclosure does not limit the implementation of the level shifter 35. A gate end of the PMOS transistor MP1 is connected to the connection point of the resistors R1 and R2 to receive the predetermined reference voltage VD, a source end of the PMOS transistor MP1 is connected to the current source IS1 and a first trimming circuit 33, and a drain end of the PMOS transistor MP1 is connected to a ground GND. A gate end of the PMOS transistor MP2 is used to receive the feedback voltage CS, a source end of the PMOS transistor MP2 is connected to the current source IS2 and a second trimming circuit 34, and a drain end of the PMOS transistor MP2 is connected to a ground GND.

The first trimming circuit 33 comprises resistors RA connected serially and fuses F1 parallel connected to the resistors RA. The second trimming circuit 34 comprises resistors RB connected serially and fuses F2 parallel connected to the resistors RB. It is noted that, to make FIG. 3 concise, FIG. 3 merely shows one resistor RA and one fuse F1 in the first trimming circuit 33 and one resistor RB and one fuse F2 in the second trimming circuit 34, but the present disclosure is not limited thereto. The fuses F1 and F2 are fused according to trimming code so as to trim the level shifted reference voltage, and thus the first trimming circuit 33 is used to generate the trimmed reference voltage (i.e. VREF+Vos) to one input end of the error amplifier EA.

To put it concretely, in the ideal case, the input voltage offset Vos does not exist, and thus all of the fuses F1 and F2 are not fused, and the first trimming circuit 33 and the second trimming circuit 34 thus outputs the reference voltage VREF (for example, 200 mini volts) and the feedback voltage to the error amplifier EA. When the input voltage offset Vos is positive, at least one fuse F1 is fused, and thus the first trimming circuit 33 generates the trimmed reference voltage (i.e. VREF+Vos) to the error amplifier EA. When the input voltage offset Vos is negative, at least one fuse F2 is fused, and thus the second trimming circuit 34 generates the trimmed feedback voltage (i.e. CS+Vos) to the error amplifier EA.

It is noted that the resistors RA can have different resistances. For example, the resistances of the resistors RA can be 0.25R, 0.5R, R, 2R, 4R, and R multiplying the other powers of 2, wherein R is the unit resistance. In the similar manner, the resistances of the resistors RB can be 0.25R, 0.5R, R, 2R, 4R, and R multiplying the other powers of 2. However, the resistances of the resistors RA and RB are not used to limit the present disclosure.

The PMOS transistors MP1 and MP2 may not be designed to be matched, since the trimmed reference voltage or the trimmed feedback voltage of the first or second trimming circuit 33, 34 not only compensates the input voltage offset Vos of the error amplifier, but also compensates the mismatch of PMOS transistors MP1 and MP2 in the level shifter 35.

The compensation current sinking device 36 is used to sink the compensation current, wherein the compensation current is the summation of the currents Ios_B, Ios_A passing through the first trimming circuit 33 and the second trimming circuit 34. The compensation current sinking device 36 comprises an operation amplifier Ios_OP with a high gain and a less voltage offset, NMOS transistors MN1, MN2, and a resistor RC. Input ends of the operation amplifier Ios_OP are respectively connected to the predetermined reference voltage VD (or the other regulated voltage reference) and one end of the resistor RC. Gate ends of the NMOS transistors MN1 and MN2 are connected to the output end of the operation amplifier Ios_OP. Source ends of the NMOS transistors MN1 and MN2 are connected to one end of the resistor RC, and other one end of the resistor RC is connected to the ground GND. Drain ends of the NMOS transistors MN1 and MN2 are respectively connected to the second trimming circuit 34 and the first trimming circuit 33.

The NMOS transistors MN1 and MN2 should be designed to match each other, such that the currents Ios_B, Ios_A passing through the NMOS transistors MN1 and MN2 are identical. Furthermore, the resistance of the resistor RC can be the multiple of the unit resistance R, for example, 10R, and that is, the resistors RA, RB, RC should be designed to be matched. It is noted that the design for matching resistors RA, RB, RC is easier than the design for matching transistors, and the design for matching merely two NMOS transistors MN1 and MN2 is easier than the design for matching more than two transistors.

For example, when the predetermined reference voltage is 200 mini volts (mv), the resistance of the resistor RC is 10R, and the input voltage offset Vos is 5 mini volts, one fuse F1 corresponding to the resistor RA with 5R resistance in the first trimming circuit 33 is fused, so as to compensate the input voltage offset Vos with 5 mini volts. That is, the increment voltage on the reference voltage VREF is Vos_c=0.5*(200 mv/10R)*RA, and the resistance of the resistor RA should be 0.5R when Vos_c is 5 mini volts, wherein the current Ios_B passing through the first trimming circuit 33 is 0.5*(200 mv/10R).

As mentioned above, the operation amplifier Ios_OP has a small voltage offset, and the voltage offset of operation amplifier Ios_OP can be divided by the resistance of the resistor RC. For example, in the case of three standard deviations, the error amplifier EA has the maximum input voltage offset Vos of 20 mini volts, the voltage offset of operation amplifier Ios_OP is denoted as Vos_x, and one fuse corresponding to the resistor RA with the resistance of 2R should be fused. The increment voltage on the reference voltage VREF is Vos_c=0.5*(200 mv+Vos_x)/10R*2R=20 mv+Vos_x/10. Assume the input stage size of the operation amplifier Ios_OP is 400 μm², and in the case of three standard deviations, the maximum of the voltage offset Vos_x is 3.3 mini volts. Thus, the voltage offset Vos_x affecting on the increment voltage on the reference voltage VREF is just 0.33 mini volts. The 0.33 mini volts is 0.165% variation of 200 mini volts, and it meets the specification of +/−3% variation of the 200 mini volts.

Accordingly, in the exemplary embodiment of the present disclosure, the provided compensation circuit for the input voltage offset of the error amplifier can be designed easily and have a small area, since merely two transistors should be designed to be matched and resistors should be designed to be matched. Moreover, during the circuit probing process, merely the input voltage offset should be known, and the biasing current of the error amplifier and transconductance of the error amplifier can be ignored.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A compensation circuit used to compensate an input voltage offset of an error amplifier, comprising:
    a level shifter, used to shift levels of a feedback voltage and a predetermined reference voltage, and thus to output a level shifted feedback voltage and a level shifted reference voltage;
    a first trimming circuit, connected to the level shifter and the error amplifier, used to adjust the level shifted reference voltage by trimming a first resistance thereof according to a trimming code, wherein the trimming code has the ratio relation of the input voltage offset and a resistance to be trimmed;
    a second trimming circuit, connected to the level shifter and the error amplifier, used to adjust the level shifted feedback voltage by trimming a second resistance thereof according to a trimming code; and
    a compensation current sinking device, connected to the first and second trimming circuits, used to sink currents passing through the first and second trimming circuits.

2. The compensation circuit according to claim 1, wherein when the input voltage offset is positive, the first trimming circuit outputs a trimmed reference voltage to one input end of the error amplifier, and the second trimming circuit outputs the feedback voltage to other one input end of the error amplifier.

3. The compensation circuit according to claim 1, wherein when the input voltage offset is negative, the first trimming circuit outputs a reference voltage to one input end of the error amplifier, and the second trimming circuit outputs a trimmed feedback voltage to other one input end of the error amplifier, wherein the reference voltage is equal to the predetermined reference voltage.

4. The compensation circuit according to claim 1, wherein the level shifter comprises:
    a first current source;
    a second current source;
    a first PMOS transistor, a gate end thereof is used to receive the predetermined reference voltage, a source end thereof is connected to the first current source and the first trimming circuit, and a drain end thereof is connected to a ground; and
    a second PMOS transistor, a gate end thereof is used to receive the feedback voltage, a source end thereof is connected to the second current source and the second trimming circuit, and a drain end thereof is connected to the ground.

5. The compensation circuit according to claim 1, wherein first trimming circuit comprises a plurality of first resistors connected serially and a plurality of first fuses parallel connected to the first resistors, wherein the first fuses are fused according to the trimming code.

6. The compensation circuit according to claim 5, wherein second trimming circuit comprises a plurality of second resistors connected serially and a plurality of second fuses parallel connected to the second resistors, wherein the second fuses are fused according to the trimming code.

7. The compensation circuit according to claim 6, wherein the compensation current sinking device comprises:
    an operation amplifier, one input end thereof is used to receive the predetermined reference voltage;
    a third resistor, one end thereof is connected to other one input end of the operation amplifier, and other one end thereof is connected to a ground;
    a first NMOS transistor, a gate end thereof is connected to an output end of the operation amplifier, a drain end thereof is connected to the second trimming circuit, and a source end thereof is connected to the one end of the third resistor; and
    a second NMOS transistor, a gate end thereof is connected to an output end of the operation amplifier, a drain end thereof is connected to the first trimming circuit, and a source end thereof is connected to the one end of the third resistor.

8. The compensation circuit according to claim 7, wherein the first through third resistors are designed to be matched, and the first and second NMOS transistors are designed to be matched.

9. The compensation circuit according to claim 1, further comprising:
    a bandgap voltage generator, used to generate a bandgap voltage; and
    a voltage divider, connected to the bandgap voltage generator and the level shifter, used to divide the bandgap voltage to generate the predetermined reference voltage.

10. The compensation circuit according to claim 9, wherein the voltage divider comprises a plurality of resistors connected serially, and a connection point of the two resistors is used to output the predetermined reference voltage.

11. An error amplifier circuit, comprising:
an error amplifier; and
a compensation circuit used to compensate an input voltage offset of the error amplifier, comprising:
a level shifter, used to shift levels of a feedback voltage and a predetermined reference voltage, and thus to output a level shifted feedback voltage and a level shifted reference voltage;
a first trimming circuit, connected to the level shifter and the error amplifier, used to adjust the level shifted reference voltage by trimming a first resistance thereof according to a trimming code, wherein the trimming code has the ratio relation of the input voltage offset and a resistance to be trimmed;
a second trimming circuit, connected to the level shifter and the error amplifier, used to adjust the level shifted feedback voltage by trimming a second resistance thereof according to a trimming code; and
a compensation current sinking device, connected to the first and second trimming circuits, used to sink currents passing through the first and second trimming circuits.

12. The error amplifier circuit according to claim 11, wherein when the input voltage offset is positive, the first trimming circuit outputs a trimmed reference voltage to one input end of the error amplifier, and the second trimming circuit outputs the feedback voltage to other one input end of the error amplifier.

13. The error amplifier circuit according to claim 11, wherein when the input voltage offset is negative, the first trimming circuit outputs a reference voltage to one input end of the error amplifier, and the second trimming circuit outputs a trimmed feedback voltage to other one input end of the error amplifier, wherein the reference voltage is equal to the predetermined reference voltage.

14. The error amplifier circuit according to claim 11, wherein the level shifter comprises:
a first current source;
a second current source;
a first PMOS transistor, a gate end thereof is used to receive the predetermined reference voltage, a source end thereof is connected to the first current source and the first trimming circuit, and a drain end thereof is connected to a ground; and
a second PMOS transistor, a gate end thereof is used to receive the feedback voltage, a source end thereof is connected to the second current source and the second trimming circuit, and a drain end thereof is connected to the ground.

15. The error amplifier circuit according to claim 11, wherein first trimming circuit comprises a plurality of first resistors connected serially and a plurality of first fuses parallel connected to the first resistors, wherein the first fuses are fused according to the trimming code.

16. The error amplifier circuit according to claim 15, wherein second trimming circuit comprises a plurality of second resistors connected serially and a plurality of second fuses parallel connected to the second resistors, wherein the second fuses are fused according to the trimming code.

17. The error amplifier circuit according to claim 16, wherein the compensation current sinking device comprises:
an operation amplifier, one input end thereof is used to receive the predetermined reference voltage;
a third resistor, one end thereof is connected to other one input end of the operation amplifier, and other one end thereof is connected to a ground;
a first NMOS transistor, a gate end thereof is connected to an output end of the operation amplifier, a drain end thereof is connected to the second trimming circuit, and a source end thereof is connected to the one end of the third resistor; and
a second NMOS transistor, a gate end thereof is connected to an output end of the operation amplifier, a drain end thereof is connected to the first trimming circuit, and a source end thereof is connected to the one end of the third resistor.

18. The error amplifier circuit according to claim 17, wherein the first through third resistors are designed to be matched, and the first and second NMOS transistors are designed to be matched.

19. The error amplifier circuit according to claim 11, the compensation circuit further comprises:
a bandgap voltage generator, used to generate a bandgap voltage; and
a voltage divider, connected to the bandgap voltage generator and the level shifter, used to divide the bandgap voltage to generate the predetermined reference voltage.

20. The error amplifier circuit according to claim 19, wherein the voltage divider comprises a plurality of resistors connected serially, and a connection point of the two resistors is used to output the predetermined reference voltage.

* * * * *